United States Patent
Huang

(10) Patent No.: US 8,902,212 B2
(45) Date of Patent: Dec. 2, 2014

(54) IMAGE DISPLAY SYSTEMS AND BI-DIRECTIONAL SHIFT REGISTER CIRCUITS

(71) Applicant: InnoLux Corporation, Miao-Li County (TW)

(72) Inventor: Sheng-Feng Huang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 112 days.

(21) Appl. No.: 13/799,460

(22) Filed: Mar. 13, 2013

(65) Prior Publication Data
US 2013/0265291 A1   Oct. 10, 2013

(30) Foreign Application Priority Data
Apr. 6, 2012 (TW) .............................. 101112183 A

(51) Int. Cl.
| | | |
|---|---|---|
| G06F 3/038 | (2013.01) | |
| G11C 19/28 | (2006.01) | |
| G09G 5/00 | (2006.01) | |
| G09G 3/36 | (2006.01) | |

(52) U.S. Cl.
CPC .............. *G11C 19/287* (2013.01); *G09G 5/001* (2013.01); *G11C 19/28* (2013.01); *G09G 3/36* (2013.01)
USPC ............ 345/212; 345/559; 345/204; 345/100

(58) Field of Classification Search
None
See application file for complete search history.

(56) References Cited

U.S. PATENT DOCUMENTS

| | | | |
|---|---|---|---|
| 8,369,479 B2 | 2/2013 | Lin et al. | |
| 2006/0001622 A1* | 1/2006 | Kim | ................................ 345/76 |
| 2006/0170643 A1 | 8/2006 | Katayama | |
| 2006/0267912 A1* | 11/2006 | Lee et al. | ...................... 345/100 |
| 2011/0316831 A1 | 12/2011 | Ochiai et al. | |

FOREIGN PATENT DOCUMENTS

| | | |
|---|---|---|
| TW | 355782 | 4/1999 |
| TW | 201140603 | 11/2011 |

OTHER PUBLICATIONS

Taiwanese language office action dated Apr. 4, 2014.
English language translation of abstract of TW 355782 (published Apr. 11, 1999).
English language translation of abstract of TW 201140603 (published Nov. 16, 2011).

\* cited by examiner

*Primary Examiner* — Muhammad N Edun
(74) *Attorney, Agent, or Firm* — McClure, Qualey & Rodack, LLP

(57) ABSTRACT

A bi-directional shift register circuit includes multiple stages of shift registers for generating multiple gate driving signals. At least one shift register includes an input stage circuit, an output stage circuit, a first and a second transistor. The input stage circuit is coupled to a first and a second signal input terminal. The output stage circuit receives a first clock signal and generating a corresponding gate driving signal. The first transistor includes a first terminal coupled to a first node, a second terminal coupled to a second node and a third terminal coupled to a high operation voltage. The second transistor includes a first terminal coupled to the second node, a second terminal coupled to the first node and a third terminal coupled to the high operation voltage. The first transistor charges the first node and the second transistor discharges the second node.

20 Claims, 6 Drawing Sheets

IMAGE DISPLAY SYSTEMS AND BI-DIRECTIONAL SHIFT REGISTER CIRCUITS

CROSS REFERENCE TO RELATED APPLICATIONS

This Application claims priority of Taiwan Patent Application No. 101112183, filed on Apr. 6, 2012, the entirety of which is incorporated by reference herein.

BACKGROUND

1. Field

The invention relates to a shift register, and more particularly to a bi-directional shift register capable of operating in a forward direction and a reverse direction.

2. Description of the Related Art

Shift registers have been widely used in data driving circuits and gate driving circuits, for controlling timing in receiving data signals in each data line and for generating a scanning signal for each gate line. In a data driving circuit, a shift register outputs a selection signal so as to write an image signal into each data line. Meanwhile, in the gate driving circuit, the shift register outputs a scanning signal so as to sequentially write the image signal supplied to each data line into pixels in a pixel array.

A conventional shift register generates the selection signal or scanning signal in only a single direction. However, a single scanning direction does not satisfy the entire requirements of LCD products. For example, some display types of digital cameras are rotated according to the placement angle of the camera. In addition, some LCD monitors comprise the function of rotating the monitor, so an LCD display with different scanning turns is required. Therefore, a novel bi-directional shift register capable of outputting signals in a forward direction and a reverse direction is desired.

BRIEF SUMMARY

Image display systems and bi-directional shift register circuits are provided. An exemplary embodiment of an image display system comprises a gate driving circuit for generating a plurality of gate driving signals to drive a plurality of pixels in a pixel array. The gate driving circuit comprises a bi-directional shift register circuit, the bi-directional shift register circuit comprises a plurality of stages of shift registers coupled in serial each for generating one of the gate driving signals. At least one of the shift registers comprises an input stage circuit, an output stage circuit, a first transistor and a second transistor. The input stage circuit is coupled to a first signal input terminal and a second signal input terminal for receiving a first input signal and a second input signal. The first input signal is a start pulse or the corresponding gate driving signal generated by a previous stage of shift register, and the second input signal is the corresponding gate driving signal generated by a following stage of shift register or the start pulse. The output stage circuit is coupled to a first clock input terminal for receiving a first clock signal and generating the corresponding gate driving signal at an output terminal according to the first clock signal. The first transistor comprises a first terminal coupled to the output stage circuit at a first node, a second terminal coupled to the output stage circuit at a second node and a third terminal coupled to a high operation voltage. The second transistor comprises a first terminal coupled to the first transistor at the second node, a second terminal coupled to the first transistor at the first node and a third terminal coupled to the high operation voltage. The first transistor charges the first node and the second transistor discharges the second node.

An exemplary embodiment of a bi-directional shift register circuit includes multiple stages of shift registers for generating multiple gate driving signals. At least one of the shift registers includes an input stage circuit, an output stage circuit, a first transistor and a second transistor. The input stage circuit is coupled to a first signal input terminal and a second signal input terminal The output stage circuit is coupled to a first clock input terminal for receiving a first clock signal and generating a corresponding gate driving signal. The first transistor includes a first terminal coupled to a first node, a second terminal coupled to a second node and a third terminal coupled to a high operation voltage. The second transistor includes a first terminal coupled to the second node, a second terminal coupled to the first node and a third terminal coupled to the high operation voltage. The first transistor charges the first node and the second transistor discharges the second node.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
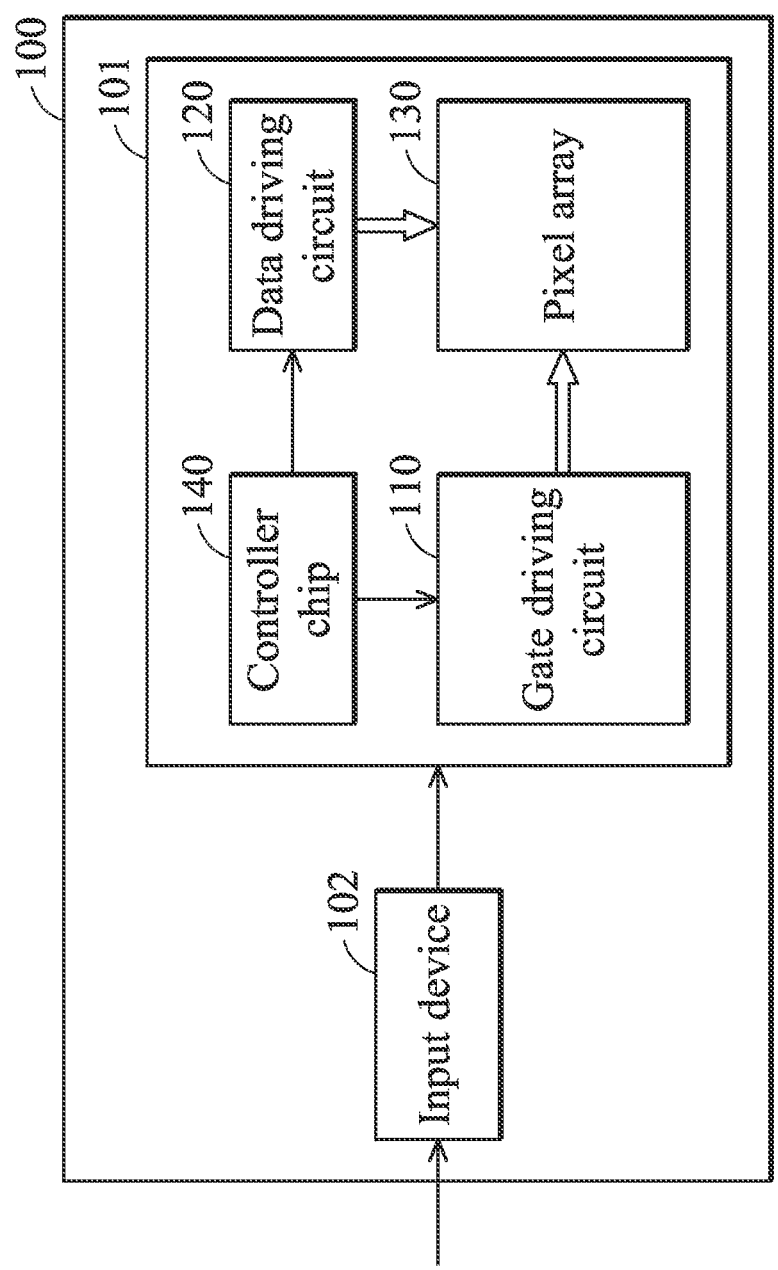
FIG. 1 shows one of the various types of image display systems of the invention according to an embodiment of the invention.

FIG. 1 shows one of the various types of image display systems of the invention according to an embodiment of the invention. As shown in FIG. 1, the image display system may comprise a display panel 101, where the display panel 101 may comprise a gate driving circuit 110, a data driving circuit 120, a pixel array 130 and a controller chip 140. The gate driving circuit 110 generates a plurality of gate driving signals to drive a plurality of pixels in the pixel array 130. The data driving circuit 120 generates a plurality of data driving signals to provide data to the pixels of the pixel array 130. The controller chip 140 generates a plurality of timing signals, comprising clock signals, reset signals and start pulses.

In addition, the image display system of the invention may further be comprised in an electronic device 100. The electronic device 100 may comprise the above-mentioned display panel 101 and an input device 102. The input device 102 receives image signals and controls the display panel 101 to display images. According to an embodiment of the invention, the electronic device 100 may be implemented as various devices, comprising: a mobile phone, a digital camera, a personal digital assistant (PDA), a lap-top computer, a personal computer, a television, an in-vehicle display, a portable DVD player, or any apparatus with image display functionality.

According to an embodiment of the invention, the gate driving circuit 110 may comprise a bi-directional shift register circuit capable of sequentially generating a corresponding gate driving signal to each gate line in different scan directions (for example, forward scan direction and reverse scan direction), so as to write the image signal provided to each data line to the pixels in the pixel array 130.

Figure 2:
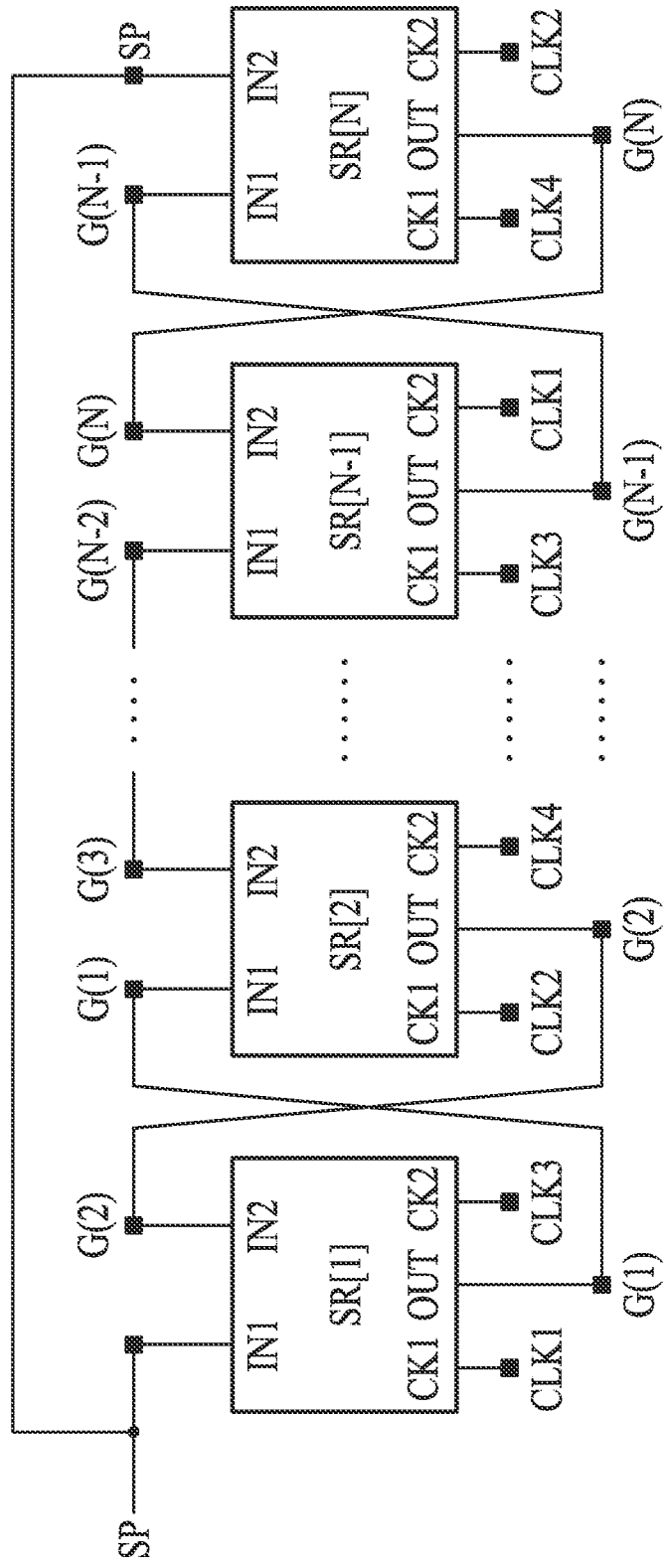
FIG. 2 shows a structure of a bi-directional shift register circuit according to an embodiment of the invention.

FIG. 2 shows a structure of a bi-directional shift register circuit according to an embodiment of the invention. The bi-directional shift register circuit 200 comprises a plurality of stages of shift registers SR[1], SR[2] ..., SR[N−1], SR[N] coupled in serial, each for generating one of a plurality of gate driving signals G(1)~G(N). Each shift register comprises signal input terminals IN1 and IN2, clock input terminals CK1 and CK2 and an output terminal OUT.

As shown in FIG. 2, the first stage of shift register SR[1] receives the start pulse SP through the input terminal IN1 and the input terminal IN1 of the remaining stages of shift registers SR[2]~SR[N] is coupled to the output terminal OUT of an adjacent shift register (for example, a previous stage of shift register SR[1]~SR[N−1]) for receiving the corresponding gate driving signal from that shift register. Another input terminal IN2 of the shift registers SR[1]~SR[N−1] is coupled to the output terminal OUT of another adjacent shift register (for example, a following stage of shift register SR[2]~SR[N]) for receiving the corresponding gate driving signal from that shift register. The last stage of shift register SR[N] receives the start pulse SP from the input terminal IN2.

In forward scan, the shift registers SR[1]~SR[N] sequentially output the corresponding gate driving signals G(1)~G(N), and in reverse scan, the shift registers SR[N]~SR[1] sequentially output the corresponding gate driving signals G(N)~G(1).

Note that in the embodiments of the invention, the bi-directional shift register circuit may comprise at least four stages of shift registers coupled in serial, where an amount of the shift registers can be a multiple of four. In addition, in the embodiments of the invention, the bi-directional shift register may receives four clock signals CLK1~CLK4, where the clock signals CLK1~CLK4 may comprise a plurality of timing interleaved pulses. For example, take the high active clock signals CLK1~CLK4 shown in FIG. 5 as an example: the time intervals when the clock signals CLK1~CLK4 have high voltage level do not overlap.

In addition, note that in some embodiments, the shift registers SR[1]~SR[N] receive the clock signals CLK1~CLK4 in a cyclical manner. For example, as shown in FIG. 2, the first stage of shift register SR[1] receives the clock signals CLK1 and CLK3 through the clock input terminals CK1 and CK2 respectively, the second stage of shift register SR[2] receives the clock signals CLK2 and CLK4 through the clock input terminals CK1 and CK2 respectively, the third stage of shift register SR[3] receives the clock signals CLK3 and CLK1 respectively through the clock input terminals CK1 and CK2 respectively, and the fourth stage of shift register SR[4] receives the clock signals CLK4 and CLK2 through the clock input terminals CK1 and CK2 respectively. A cycle can be formed by four stages of shift registers, and the following stages of shift registers may repeat this cycle.

Figure 3:
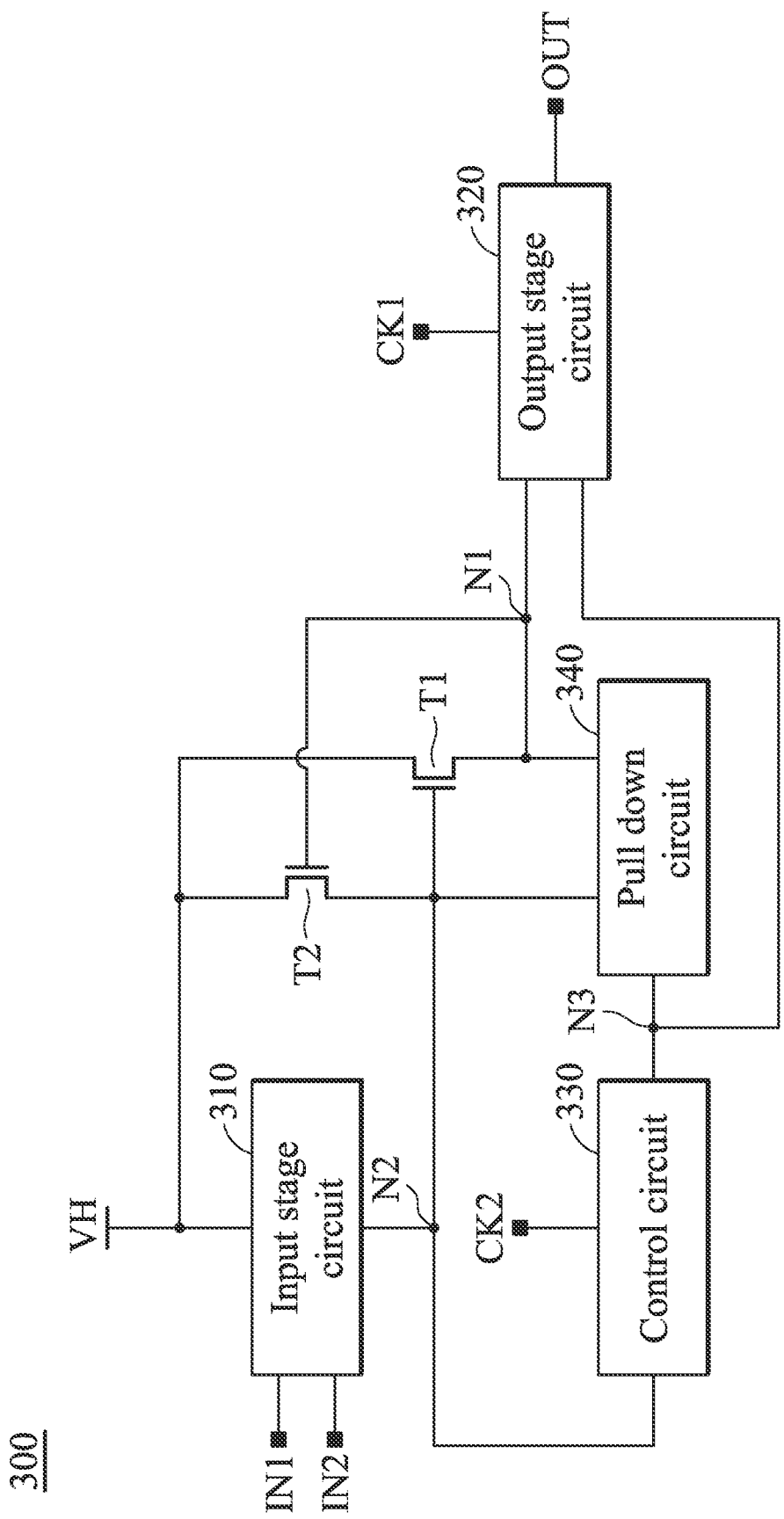
FIG. 3 shows a block diagram of a shift register according to an embodiment of the invention.

FIG. 3 shows a block diagram of a shift register according to an embodiment of the invention. The shift register 300 may comprise an input stage circuit 310, an output stage circuit 320, a control circuit 330 and a pull down circuit 340. The input stage circuit 310 may be coupled to the signal input terminals IN1 and IN2 for receiving the corresponding gate driving signal from the adjacent shift register and/or the start pulse. The output stage circuit 320 may be coupled to the clock input terminal CK1 for receiving a clock signal and generating the corresponding gate driving signal at the output terminal OUT according to the clock signal. The control circuit 330 may be coupled to the clock input terminal CK2 for receiving another clock signal and controlling the voltage level at the control node N3 according to the clock signal. The pull down circuit 340 may be coupled to the control circuit 330 and the output stage circuit 320 for pulling down the voltages at a plurality of nodes of the shift register according to the voltage at the control node N3 (which will be illustrated in more detailed in the following paragraphs).

According to an embodiment of the invention, the shift register 300 may further comprise transistors T1 and T2. The transistors T1 and T2 may be coupled to node N1, node N2 and the high operation voltage VH. A first terminal of the transistor T1 may be coupled to the output stage circuit 320 at node N1, a second terminal of the transistor T1 may be coupled to the input stage circuit 310 at node N2, and a third terminal of the transistor T1 may be coupled to the high operation voltage VH. A first terminal of the transistor T2 may be coupled to the transistor T1 at node N2, a second terminal of the transistor T2 may be coupled to the transistor T1 at node N1, and a third terminal of the transistor T2 may be coupled to the high operation voltage VH. According to an embodiment of the invention, the transistor T1 charges node N1 and the second transistor T2 discharge node N2.

Figure 4:
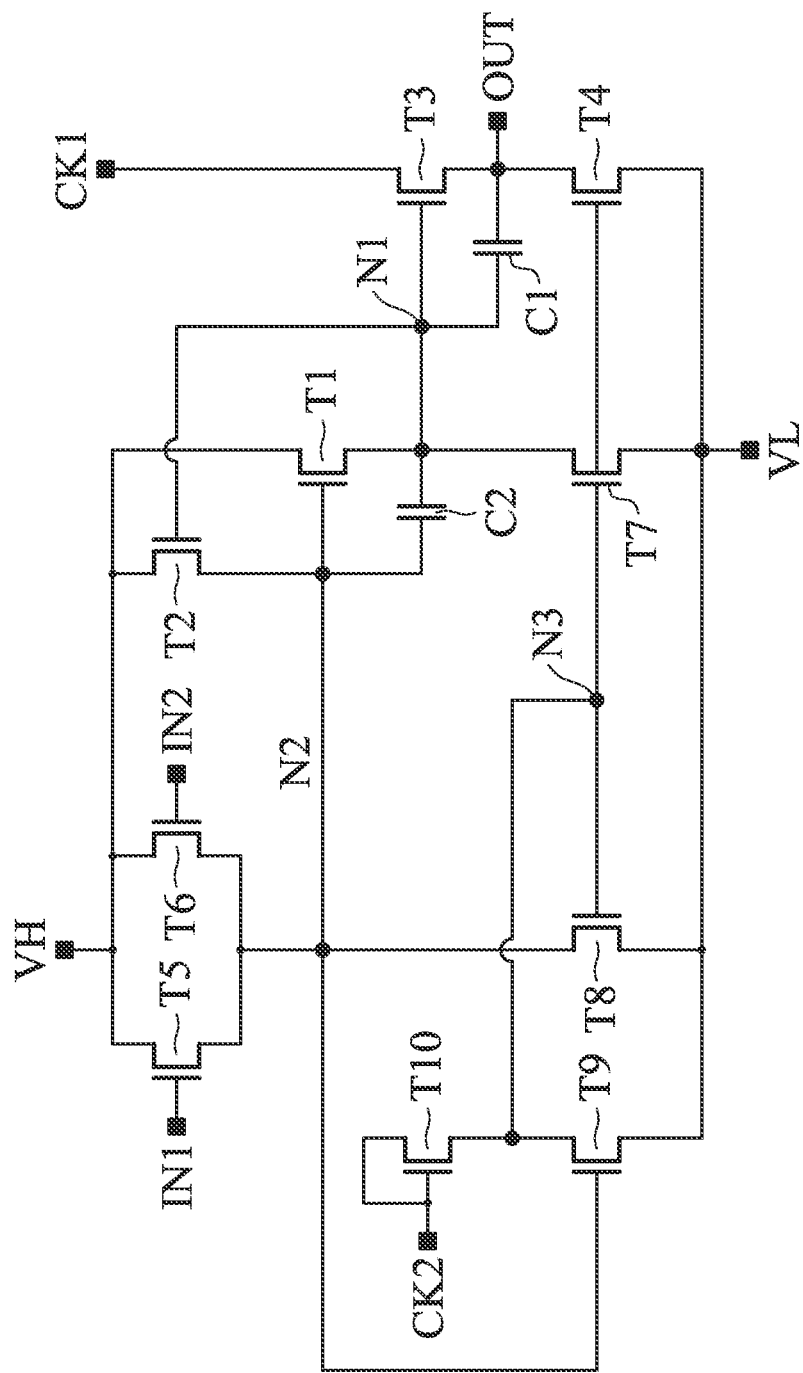
FIG. 4 shows a circuit diagram of a shift register according to an embodiment of the invention.

FIG. 4 shows a circuit diagram of a shift register according to an embodiment of the invention. According to an embodiment of the invention, the shift register may comprise transistors T1~T10, where the transistor T3 may be comprised in the output stage circuit, the transistors T5 and T6 may be comprised in the input stage circuit, the transistor T9 and T10 may be comprised in the control circuit and the transistors T4, T7 and T8 may be comprised in the pull down circuit. Note that in some embodiments of the invention, the transistor T4 may also be regarded as a part of the output stage circuit.

A first terminal of the transistor T3 may be coupled to the output terminal OUT, a second terminal of the transistor T3 may be coupled to the node N1 and a third terminal of the transistor T3 may be coupled to the clock input terminal CK1. A first terminal of the transistor T4 may be coupled to the low operation voltage VL, a second terminal of the transistor T4 may be coupled to the control node N3, and a third terminal of the transistor T4 may be coupled to the output terminal OUT. A first terminal of the transistor T5 may be coupled to node N2, a second terminal of the transistor T5 may be coupled to the signal input terminal IN1, and a third terminal of the transistor T5 may be coupled to the high operation voltage VH. A first terminal of the transistor T6 may be coupled to node N2, a second terminal of the transistor T6 may be coupled to the signal input terminal IN2, and a third terminal of the transistor T6 may be coupled to the high operation voltage VH.

A first terminal of the transistor T7 may be coupled to the low operation voltage VL, a second terminal of the transistor T7 may be coupled to the control node N3, and a third terminal of the transistor T7 may be coupled to node N1. A first terminal of the transistor T8 may be coupled to the low operation voltage VL, a second terminal of the transistor T8 may be coupled to the control node N3, and a third terminal of the transistor T8 may be coupled to node N2. A first terminal of the transistor T9 may be coupled to the low operation voltage VL, a second terminal of the transistor T9 may be coupled to node N2, and a third terminal of the transistor T9 may be coupled to the control node N3. A first terminal of the transistor T10 may be coupled to the control node N3, and the second and third terminals may be coupled to the clock input terminal CK2.

Figure 5:
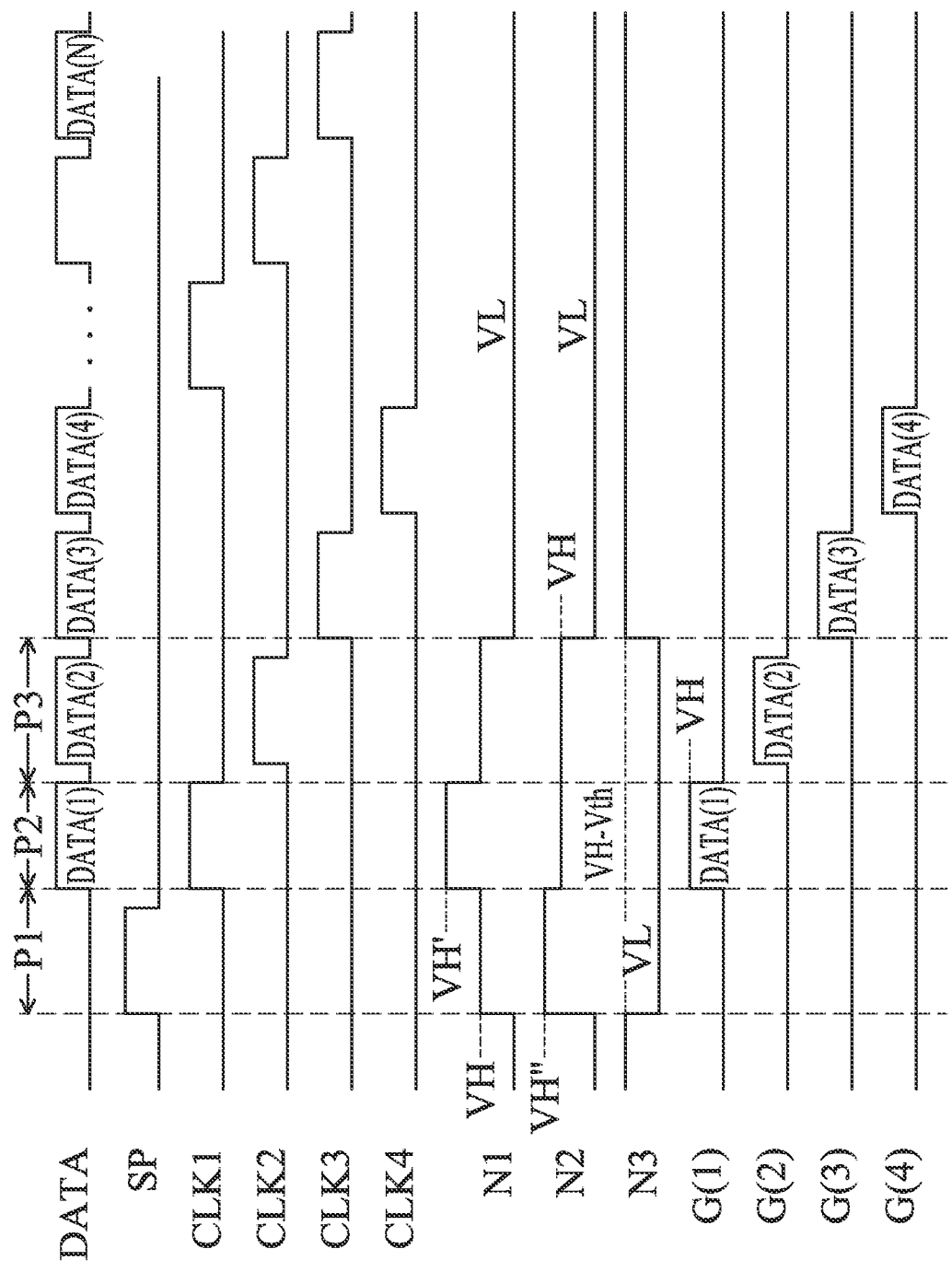
FIG. 5 shows the signal waveforms and voltages at each node of the shift register in forward scan according to an embodiment of the invention.

Besides transistors T1~T10, the shift register may further comprise capacitors C1 and C2. Note that the capacitors C1 and C2 may respectively be the parasitical capacitors of the transistors T3 and T1 or extra coupled capacitors, and the invention should not be limited thereto. FIG. 5 shows the signal waveforms and voltages at each node of the shift register in forward scan according to an embodiment of the invention. In FIG. 5, the signal waveforms and voltages as shown are the corresponding signal waveforms and voltages in the first stage of shift register SR[1]. Combining FIG. 4 and FIG. 5, operations of the proposed shift register will be illustrated in more detailed in the following paragraphs.

According to an embodiment of the invention, when the start pulse SP arrives, the shift register SR[1] enters a first phase P1. In the first phase P1, the transistor T5 is turned on in response to a first edge of the start pulse SP and the voltage at node N2 is pulled high to a high voltage level approaching the high operation voltage VH minus a threshold voltage of the transistor T5. The high voltage at node N2 turns on the transistor T1, and through the turned-on transistor T1, the voltage at node N1 is charged to a high voltage level approaching the high operation voltage VH minus a threshold voltage of the transistor T1.

Because the voltage at node N1 changes from a level of the low operation voltage VL to a high voltage level, the voltage change is coupled to node N2 through the capacitor C2 so that the voltage at node N2 is further pulled high to another high voltage level VH" higher than the high operation voltage VH, that is VH">VH.

Because the voltage at node N2 is further pulled high, the voltage at the second terminal of the transistor T1 is raised and the conducting current of the transistor T1 is increased so as to further charge the voltage at node N1 to a level approaching or equal to the high operation voltage VH. Note that the above mentioned voltage changes at nodes N1 and N2 happen instantaneously at the time of the first edge of the start pulse SP, and the voltage at node N1 is finally charged to and kept at a voltage level approaching or equal to the high voltage level VH, and the voltage at node N21 is finally charged to and kept at the high voltage level VH". Therefore, as shown in FIG. 5, in the first phase P1, the voltage at node N1 is labeled by VH and the voltage at node N2 is labeled by VH".

According to an embodiment of the invention, because the voltage at node N1 is finally pulled up to a level approaching or equal to the high operation voltage VH, the voltage drop caused by the threshold voltage Vth of the transistor T1 is cancelled. In this manner, even if the threshold voltage of the transistor is shifted, the high voltage at node N1 is still sufficient to turn on the transistor T3 in the first phase P1 and the capacitor C1 may be used to store a voltage that is about the voltage difference between node N1 and the output terminal OUT. For example, when the output terminal OUT is initialized to a level of the low operation voltage VL, the voltage stored in the capacitor C1 equals to (VH-VL).

When a pulse of the clock signal CK1 arrives, the shift register SR[1] enters a second phase P2. Because the arrival of the pulse of the clock signal CK1 generates a voltage rise at the clock input terminal CK, such a voltage rise is added to node N1 via the turned on transistor T3. Therefore, in the second phase P2, the voltage at node N1 is further pulled high to a high voltage level VH'. According to an embodiment of the invention, the voltage VH'>VH">VH.

In addition, the transistor T2 is turned on in response to the high voltage level VH' at node N1 so as to discharge the voltage at node N2 and pull the voltage at node N2 down to the level of the high operation voltage VH. Therefore, in FIG. 5, in the second phase P2, the voltage at node N1 is labeled by VH' and the voltage at node N2 is labeled by VH.

After the pulse of the clock signal CK1 is ended, the shift register SR[1] enters a third phase P3. In the third phase P3, because the pulse of the clock signal CK1 is ended, the voltage at node N1 is pulled down to level of the high operation voltage VH. In addition, in the third phase P3, when a pulse of the gate driving signal G(2) arrives, the transistor T6 is turned on.

When a pulse from the clock signal CK3 arrives, the shift register SR[1] enters a reset phase. In the reset phase, because the pulse of the clock signal CLK3 has a high voltage level (for example, VH), the transistor T10 is turned on in response to the high voltage and the voltage at the control node N3 is pulled high to a high voltage level approaching the high operation voltage VH minus a threshold voltage Vth of the transistor T10 (as labeled by VH-Vth). The transistors T4, T7 and T8 may further be turned on in response to the high voltage level at the control node N3 so as to pull the voltages at the output terminal OUT, node N1 and node N2 down to a level of the low operation voltage VL. When the voltage at node N2 is pulled down to the level of the low operation voltage VL, the transistor T9 is tuned off Note that conventionally, there are multiple transistors (for example, amorphous silicon transistors) utilized as the switches in a shift register so as to control the voltages at the corresponding nodes. However, after a long period of time in operation, the threshold voltage of the amorphous silicon transistor may shift. The voltage shift in the threshold voltage may affect the voltages at the nodes in the shift register, resulting in the voltages at the corresponding nodes being insufficient to successively turn on or off the corresponding transistors, and the shift register may malfunction.

However, in the embodiment of the invention, since the voltage at node N1 is pulled high through the transistor T1, the voltage drop caused by the threshold voltage Vth of the transistor T1 is cancelled so as to make sure that the transistor T3 can be turned on in response to the high voltage at node N1. In addition, in the embodiment of the invention, the voltage at node N2 may be discharged through the transistor T2 and kept at the level of high operation voltage VH in the second phase P2 and the third phase P3. The merits of keeping the voltage at node N2 in VH instead of VL is that the transistor T9 can be turned on so as to fix the voltage at the control node N3 to a low voltage level. Therefore, the circuit would not suffer from noise. If the voltage at node N2 is discharged to a level of low operation voltage VL, the transistor T9 cannot be turned on. In this case, the voltage at the control node N3 is floating and the circuit may suffer from noise.

As shown in FIG. 5, in forward scan, the gate driving signals G(1)~G(N) may be sequentially generated so that the pixels on the gate line may be sequentially turned on so as to receive the corresponding data DATA(1)~DATA(N) carried on the data driving signal DATA. Note that although only the voltages and signal waveforms at each node in the first stage shift register SR[1] is shown in FIG. 5, those skilled in the art can certainly derive the voltages and signal waveforms at each node in the remaining stages of shift registers in forward scan based on the embodiment as illustrated above. Therefore, the corresponding illustrations are omitted here for brevity.

Figure 6:
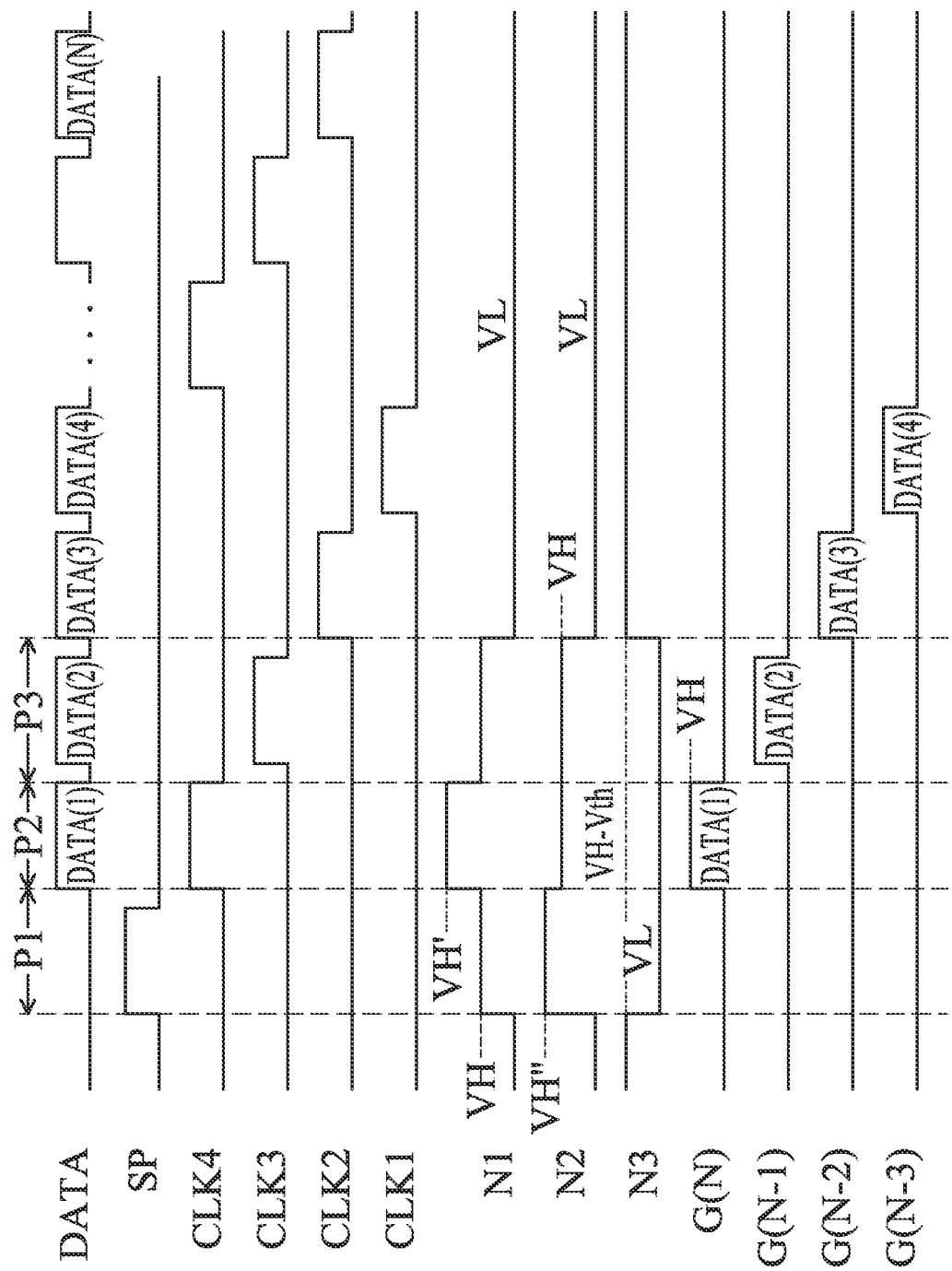
FIG. 6 shows the signal waveforms and voltages at each node of the shift register in reverse scan according to an embodiment of the invention.

FIG. 6 shows the signal waveforms and voltages at each node of the shift register in reverse scan according to an embodiment of the invention. In FIG. 6, the signal waveforms and voltages as shown are the corresponding signal waveforms and voltages in the last stage of shift register SR[N]. In the reverse scan, the shift register SR[N] receives the start pulse and each shift register SR[N]~SR[1] may sequentially generate the corresponding gate driving signal G(N)~G(1), so that the pixels on the gate line may be sequentially turned on so as to receive the corresponding data DATA(1)~DATA(N) carried on the data driving signal DATA.

The operations of the shift registers in reverse scan is similar to that in forward scan, and those skilled in the art can certainly derive the operations of the shift registers in reverse scan based on the embodiment as illustrated above. Therefore, the corresponding illustrations are omitted here for brevity. Note that because the scan direction is reversed, in the reverse scan, the transistor T6 is turned on in the first phase P1 and the transistor T5 is turned on in the third phase P3.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An image display system, comprising:
    a gate driving circuit, for generating a plurality of gate driving signals to drive a plurality of pixels in a pixel array, wherein the gate driving circuit comprises a bi-directional shift register circuit, the bi-directional shift register circuit comprises a plurality of stages of shift registers coupled in serial with each generating one of the gate driving signals, and wherein at least one of the shift registers comprises:
    an input stage circuit, coupled to a first signal input terminal and a second signal input terminal for receiving a first input signal and a second input signal, wherein the first input signal is a start pulse or the corresponding gate driving signal generated by a previous stage of shift register, and the second input signal is the corresponding gate driving signal generated by a following stage of shift register or the start pulse;
    an output stage circuit, coupled to a first clock input terminal for receiving a first clock signal and generating the corresponding gate driving signal at an output terminal according to the first clock signal;
    a first transistor, comprising a first terminal coupled to the output stage circuit at a first node, a second terminal coupled to the input stage circuit at a second node, and a third terminal coupled to a high operation voltage; and
    a second transistor, comprising a first terminal coupled to the first transistor at the second node, a second terminal coupled to the first transistor at the first node, and a third terminal coupled to the high operation voltage,
    wherein the first transistor charges the first node and the second transistor discharges the second node.

2. The image display system as claimed in claim 1, further comprising a display panel, wherein the display panel comprises:
    the gate driving circuit;
    the pixel array, comprising the pixels;
    a data driving circuit, for generating a plurality of data driving signals to provide data to the pixels in the pixel array; and
    a controller chip, for generating a plurality of clock signals and the start pulse.

3. The image display system as claimed in claim 1, wherein in forward scan, the shift registers sequentially output the corresponding gate driving signals in a first order, and wherein in reverse scan, the shift registers sequentially output the corresponding gate driving signals in a second order.

4. The image display system as claimed in claim 1, wherein when a pulse of the first input signal arrives, the first transistor is turned on for charging a voltage at the first node to a first high voltage level, so that a voltage at the second node is pulled high to a second high voltage level higher than the high operation voltage in response to voltage change at the first node.

5. The image display system as claimed in claim 4, wherein when a pulse of the first clock signal arrives, the voltage at the first node is further pulled high to a third high voltage level higher than the first high voltage level and the second transistor is turned on in response to the voltage change at the first node so as to pull the voltage at the second node down to the first high voltage level.

6. The image display system as claimed in claim 5, wherein the third high voltage level is higher than the second high voltage level, and wherein the second high voltage level is higher than the first high voltage level.

7. The image display system as claimed in claim 1, further comprising:
    a control circuit, coupled to a control node, the second node and a second clock input terminal for receiving a second clock signal; and
    a pull down circuit, coupled to the control node, the first node, the second node, a low operation voltage and the output stage circuit.

8. The image display system as claimed in claim 7, wherein when a pulse of the second clock signal arrives, the pull down circuit pulls a voltage at the first node and a voltage at the second node down to a level of the low operation voltage.

9. The image display system as claimed in claim 7, wherein the output stage circuit comprises:
    a third transistor, comprising a first terminal coupled to the output terminal, a second terminal coupled to the first node and a third terminal coupled to the first clock input terminal, and
    wherein the pull down circuit at least comprises:
    a fourth transistor, comprising a first terminal coupled to the low operation voltage, a second terminal coupled to the control node and a third terminal coupled to the output terminal.

10. The image display system as claimed in claim 9, wherein the input stage circuit comprises:
    a fifth transistor, comprising a first terminal coupled to the second node, a second terminal coupled to the first signal input terminal and a third terminal coupled to the high operation voltage; and
    a sixth transistor, comprising a first terminal coupled to the second node, a second terminal coupled to the second signal input terminal and a third terminal coupled to the high operation voltage.

11. The image display system as claimed in claim 10, wherein the pull down circuit further comprises:

a seventh transistor, comprising a first terminal coupled to the low operation voltage, a second terminal coupled to the control node and a third terminal coupled to the first node; and an eighth transistor, comprising a first terminal coupled to the low operation voltage, a second terminal coupled to the control node and a third terminal coupled to the second node.

12. The image display system as claimed in claim 11, wherein the control circuit comprises:

a ninth transistor, comprising a first terminal coupled to the low operation voltage, a second terminal coupled to the second node and a third terminal coupled to the control node; and a tenth transistor, comprising a first terminal coupled to the control node and a second terminal and a third terminal coupled to the second clock input terminal.

13. A bi-directional shift register circuit, comprising a plurality of stages of shift registers coupled in serial for generating multiple gate driving signals, wherein at least one of the shift registers comprises:

an input stage circuit, coupled to a first signal input terminal and a second signal input terminal for receiving a first input signal and a second input signal, wherein the first input signal is a start pulse or the corresponding gate driving signal generated by a previous stage of shift register, and the second input signal is the corresponding gate driving signal generated by a following stage of shift register or the start pulse;

an output stage circuit, coupled to a first clock input terminal for receiving a first clock signal and generating the corresponding gate driving signal at an output terminal according to the first clock signal;

a first transistor, comprising a first terminal coupled to the output stage circuit at a first node, a second terminal coupled to the input stage circuit at a second node and a third terminal coupled to a high operation voltage; and a second transistor, comprising a first terminal coupled to the first transistor at the second node, a second terminal coupled to the first transistor at the first node and a third terminal coupled to the high operation voltage, wherein the first transistor charges the first node and the second transistor discharges the second node.

14. The bi-directional shift register circuit as claimed in claim 13, wherein when a pulse of the first input signal arrives, the first transistor is turned on for charging a voltage at the first node to a first high voltage level, so that a voltage at the second node is pulled high to a second high voltage level higher than the high operation voltage in response to voltage change at the first node.

15. The bi-directional shift register circuit as claimed in claim 14, wherein when a pulse of the first clock signal arrives, the voltage at the first node is further pulled high to a third high voltage level higher than the first high voltage level and the second transistor is turned on in response to the voltage change at the first node so as to pull the voltage at the second node down to the first high voltage level.

16. The bi-directional shift register circuit as claimed in claim 15, wherein the third high voltage level is higher than the second high voltage level, and wherein the second high voltage level is higher than the first high voltage level.

17. The bi-directional shift register circuit as claimed in claim 13, further comprising:

a control circuit, coupled to a control node, the second node and a second clock input terminal for receiving a second clock signal; and a pull down circuit, coupled to the control node, the first node, the second node, a low operation voltage and the output stage circuit.

18. The bi-directional shift register circuit as claimed in claim 17, wherein when a pulse of the second clock signal arrives, the pull down circuit pulls a voltage at the first node and a voltage at the second node down to a level of the low operation voltage.

19. The bi-directional shift register circuit as claimed in claim 18, wherein the output stage circuit comprises:

a third transistor, comprising a first terminal coupled to the output terminal, a second terminal coupled to the first node and a third terminal coupled to the first clock input terminal, and wherein the pull down circuit at least comprises:

a fourth transistor, comprising a first terminal coupled to the low operation voltage, a second terminal coupled to the control node and a third terminal coupled to the output terminal.

20. The bi-directional shift register circuit as claimed in claim 19, wherein the input stage circuit comprises:

a fifth transistor, comprising a first terminal coupled to the second node, a second terminal coupled to the first signal input terminal and a third terminal coupled to the high operation voltage; and a sixth transistor, comprising a first terminal coupled to the second node, a second terminal coupled to the second signal input terminal and a third terminal coupled to the high operation voltage.

* * * * *